United States Patent [19]
Itakura

[11] Patent Number: 5,865,031
[45] Date of Patent: Feb. 2, 1999

[54] HEAT EXCHANGE DEVICE HAVING THERMOELECTRIC DEVICE

[75] Inventor: Masato Itakura, Toyota, Japan

[73] Assignee: Aisin Seiki Kabushiki Kaisha, Kariya, Japan

[21] Appl. No.: 865,056

[22] Filed: May 29, 1997

[30] Foreign Application Priority Data

May 29, 1996 [JP] Japan .................................. 8-135499

[51] Int. Cl.⁶ .................................................. F25B 21/02
[52] U.S. Cl. ................................................................ 62/3.7
[58] Field of Search ........................ 62/3.2, 3.3, 3.6, 62/3.7; 136/204

[56] References Cited

U.S. PATENT DOCUMENTS 2,979,551  4/1961  Pack ........................................ 62/3.7
3,663,307  5/1972  Mole ....................................... 136/204
5,315,830  5/1994  Doke et al. .............................. 62/3.2

FOREIGN PATENT DOCUMENTS 55-126177  2/1980  Japan .
62-147368  9/1987  Japan .

Primary Examiner—William Doerrler
Attorney, Agent, or Firm—Oblon, Spivak, McClelland, Maier & Neustadt, P.C.

[57] ABSTRACT

A heat exchange device has a thermoelectric device which includes P-type thermoelectric elements and N-type thermoelectric elements. One of the thermoelectric elements is secured to a first housing, and the other of the thermoelectric elements is secured to a second housing. The first and second housings forms a volume filled with an adhesive material which functions to prevent excessive loads from being applied to the thermoelectric elements.

7 Claims, 3 Drawing Sheets

HEAT EXCHANGE DEVICE HAVING THERMOELECTRIC DEVICE

BACKGROUND OF THE INVENTION

1. Field of the Invention

The present invention relates to a heat exchange device, and more particularly to such a device having a thermoelectric element.

2. Discussion of the Related Art

As a heat exchange device having thermoelectric device, for example, Japanese Utility Patent laid-open publication No. 55-126177 discloses a thermoelectric device having a cooling surface and a heating surface. A first radiator and a second radiator, which are made of heat conducting material, are connected to the cooling surface and the heating surface of the thermoelectric device, respectively. A plurality of screws are arranged between the first and second radiators to secure the thermoelectric device.

However, this heat change device has the following disadvantages:

1) The thermoelectric device is so fragile that an exacting manufacturing process control is required to load an appropriate force to secure the thermoelectric device. It is time consuming to adjust this force.

2) There is no support structure between the first and second radiators. When the first radiator and the second radiator are pressed toward one another, the thermoelectric elements may receive an excessive load force.

SUMMARY OF THE INVENTION

It is an object of the invention to provide an improved heat exchange device having a thermoelectric device that does not have the above drawbacks.

It is another object of the present invention to provide a heat exchange device having thermoelectric devices, which can prevent an excessive load force from being applied to the thermoelectric elements.

Another object of the present invention is to provide a heat exchange device having a thermoelectric device, which can reduce the manufacturing process control to produce an appropriate rigid structure for the thermoelectric element.

In accordance with the present invention, a heat exchange device comprises a thermoelectric element including a P-type thermoelectric element and an N-type thermoelectric element for generating a cooling surface and a heating surface. A first radiator is in thermal communication with the cooling surface and a first housing is connected to the first radiator. A second radiator is in thermal communication with the heating surface and a second housing is connected to the second radiator. A volume is incorporated within one of said housings and an adhesive material fills the volume and unites the first and second housings.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
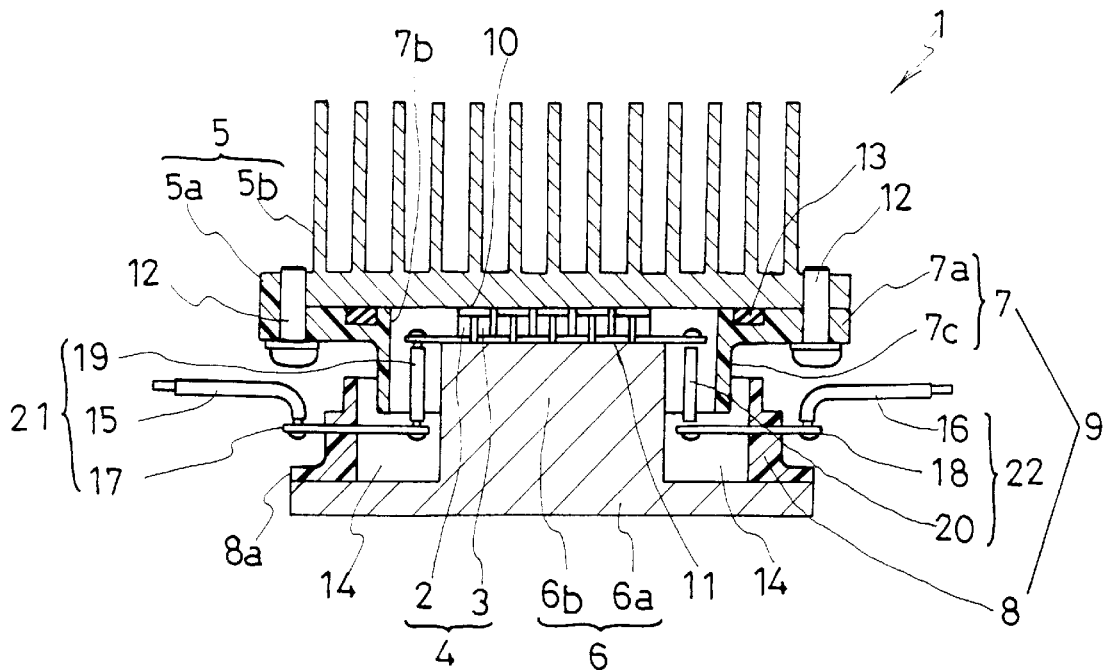
FIG. 1 is a cross-sectional view of an unfinished heat exchange device of a first embodiment according to the present invention.
Figure 2:
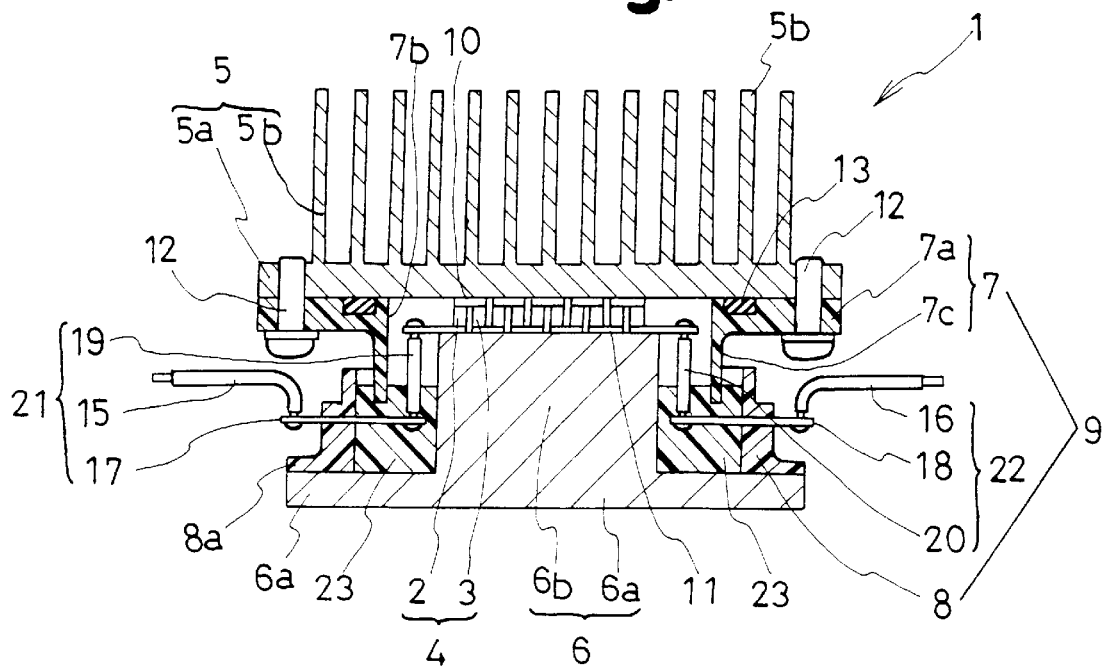
FIG. 2 is a cross-sectional view of a finished heat exchange device of the first embodiment.

Referring now to the drawings, wherein like reference numerals designate identical or corresponding parts throughout the several views, and more particularly to FIG. 1 thereof, FIG. 1 shows a cross-sectional view of an unfinished device, and FIG. 2 shows a cross-sectional view of a finished device, of a first embodiment. Referring to FIG. 1, a heat exchange device 1 includes a first radiator 5, a second radiator 6, a housing 9 and a thermoelectric device 4. The housing 9 is divided into a first housing 7 and a second housing 8. The thermoelectric device 4 includes P-type thermoelectric elements 2, N-type thermoelectric elements 3, a first electrode 10 and a second electrode 11.

The P-type thermoelectric elements 2 and the N-type thermoelectric elements 3 are alternatively arranged on the first and second electrodes 10 and 11. Specifically, one end of each P-type thermoelectric element 2 is electrically connected to the first electrode 10 and the other end of each P-type thermoelectric element 2 is electrically connected to the second electrode 11. One end of each N-type thermoelectric element 3 is electrically connected to the second electrode 11 which is connected to the other end of the corresponding P-type thermoelectric element 2. The P-type thermoelectric elements 2 and the N-type thermoelectric elements 3 are electrically connected to the electrodes in turn, and form a series circuit.

The first housing 7 has a flat portion 7a and a frame shaped side wall 7c. An opening 7b extends through the flat portion 7a and the side wall 7c. The first radiator 5 has a flat portion 5a and a plurality of radiator fins 5b. The first housing 7 and the first radiator 5 are connected by screws 12 and airtightly sealed via an O ring 13. The first radiator 5 is mounted on the opening 7b of the first housing 7.

The second housing 8 has a frame shaped side wall and a flange portion 8a. The second radiator 6 has a flat portion 6a and projecting portion 6b. The projecting portion 6b is encircled by the second housing 8. The flange portion 8a is arranged on the upper surface of the flat portion 6a.

The thermoelectric device 4 is fixed to the upper surface of the projecting portion 6b by an adhesive material via an insulator. If an insulating adhesive material is used the insulator may be omitted.

The side wall of the second housing 8, the flat portion 6a and the projecting portion 6b together form the limits of a volume 14. An adhesive material which is made from epoxy resin is used to fill the volume 14 and thereby secure the first housing 7 and the second housing 8.

The current supply means 21, 22 are comprised of outer leads 15, 16 and connectors 17, 18 and inner leads 19, 20. The inner leads 19, 20 are connected to the second electrode 11 and are guided to the exterior of the second housing 8 via the connector 17, 18. The outer leads 15, 16 are connected to the current source and are supplied with DC current (not shown in Figures).

The thermoelectric device 4 is fixed to the lower surface of the first radiator 5 by an adhesive material via an insulator. Again, if an insulating adhesive material is used, the insulator may be omitted. The edge portion of the side wall 7c extends into the volume 14.

As shown in FIG. 2, an epoxy resin series adhesive material 23 is used to fill the volume 14. The adhesive material 23 hardens in the volume 14. The adhesive material secures the second housing 8 and the second radiator 6. It also secures the first housing 7 to the second housing 8 via the edge portion of the side wall 7c.

The first radiator 5 and the first housing 7 are airtightly secured. The second radiator 6 and the second housing 8 are airtightly secured by the adhesive material 23. Further, the current supply means 21, 22 extend airtightly through the housing 9. As a result, the thermoelectric device is airtightly enclosed in the housing 9.

When an external force acts on the first radiator 5 and second radiator 6, the adhesive material 23 prevents the radiators from relatively approaching each other. Thus, during manufacturing of the heat exchange device 1 or at other times, the adhesive material 23 absorbs compressive loads between the first and second housings, and prevents the loads from reaching the thermoelectric device 4.

When current is supplied to the current supply means 21, 22, The P-type thermoelectric elements 2 and the N-type thermoelectric elements 3 produce a temperature difference at the electrodes 10 and 11, due to the Peltier Effect. The thermoelectric device 4 thus establishes a hot upper surface and a cold lower surface. Heating and cooling sources are thereby established at the thermoelectric device 4.

For example, the heat exchange device 1 can be used in a cooler and/or heater for leisure use. A box made of a conductive, e.g., aluminum, material may be fixed to the lower/upper surface of the second radiator 6. The heat exchange device 1 will cool/heat the contents of the container box. The cooling and/or heating efficiency can be increased by using a cooling fan.

If a heavy load is applied to the heat exchanger during manufacturing, e.g., when applying the box, the load is absorbed by the adhesive 23 and is not applied to the thermoelectric device 4. Moreover, the radiators 5, 6 and the housings 7, 8 are easily assembled easily using the adhesive 23 and there is no need to adjust the connecting force between the radiators 5, 6 and the thermoelectric device 4.

In this embodiment, the edge portion of the side wall 7c is located in the volume 14 and is secured by the adhesive material 23, and so load forces are absorbed by the adhesive material 23. As a result, the thermoelectric device 4 is not damaged by vibration and/or shock. Further, it is possible to reduce the number of parts (e.g., sealing parts), the amount of moisture in the housing and the manufacturing costs.

Figure 3:
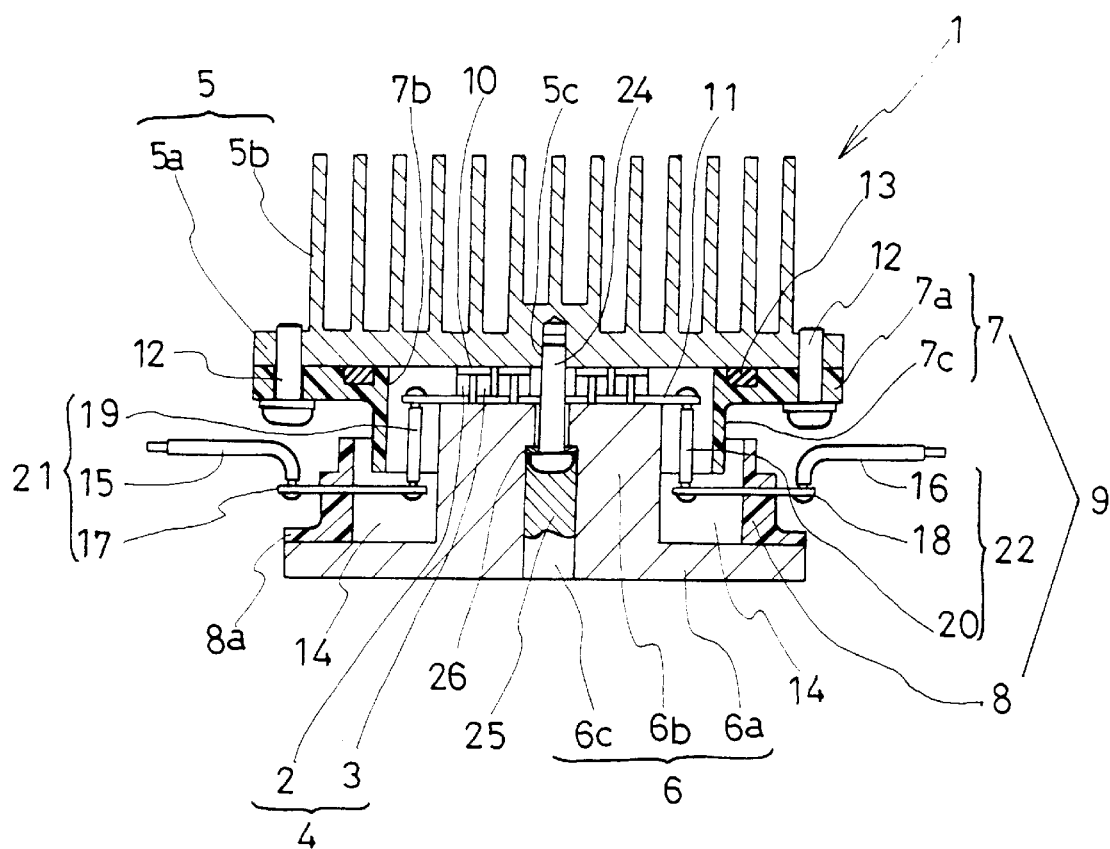
FIG. 3 is a cross-sectional view of an unfinished heat exchange device of a second embodiment according to the present invention.
Figure 4:
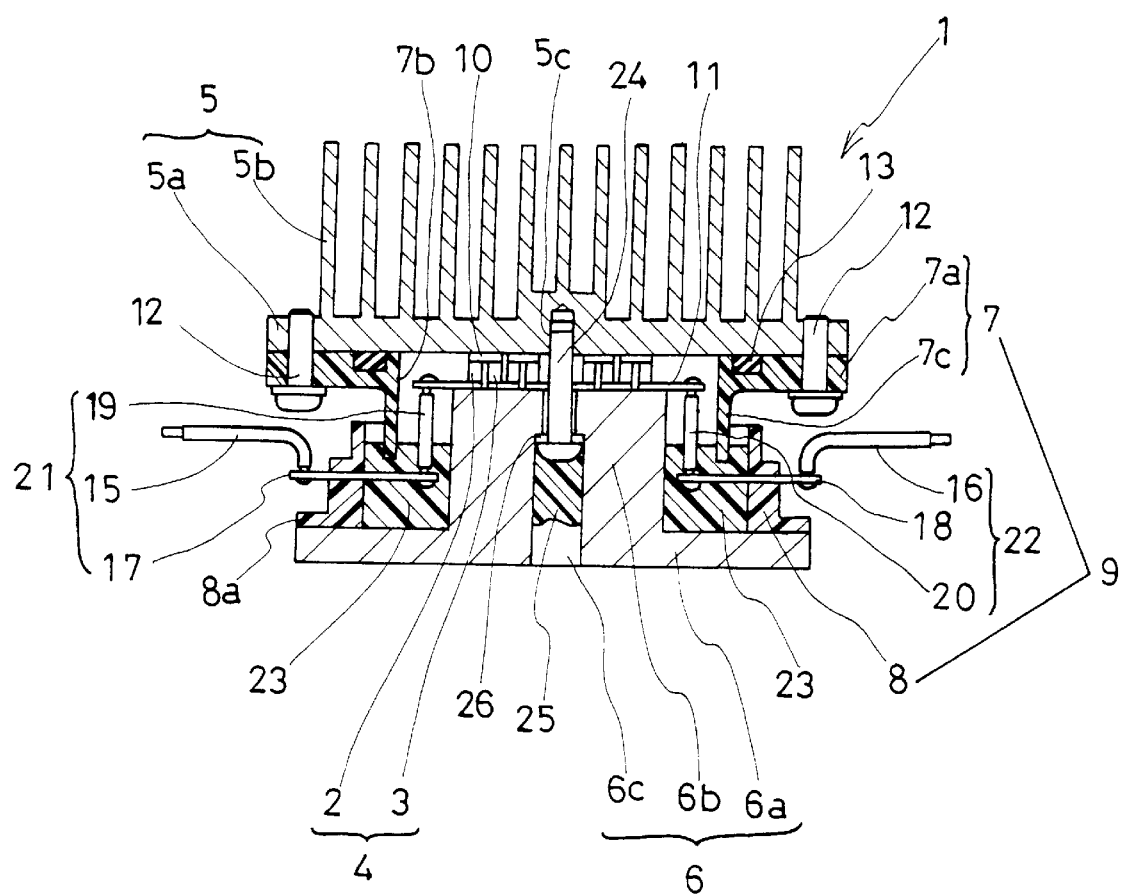
FIG. 4 is a cross-sectional view of a finished heat exchange device of the second embodiment.

FIG. 3 shows an unfinished device and FIG. 4 shows a finished device according to a second embodiment of the present invention. The same numerals represent the same elements as in the first embodiment. The first radiator 5 has a flat portion 5a, a plurality of radiator fins 5b, and a screw hole 5c formed at the center of the lower surface thereof. The second radiator 6 has a flat portion 6a, projecting portion 6b and a stepped through hole 6c located at the center thereof.

The first housing 7 and the first radiator 5 are connected by a screw 12 and airtightly sealed via an O ring 13. The first radiator 5 is mounted on the opening 7b of the first housing 7. The second housing 8 has a frame shaped side wall and a flange portion 8a. The second radiator 6 has a flat portion 6a and a projecting portion 6b. The projecting portion 6b is encircled by the second housing 8. The flange portion 8a is mounted on the upper surface of the flat portion 6a. The thermoelectric device 4 is adhesively secured to the upper surface of the projecting portion 6b via an insulator.

The current supply means 21, 22 are connected to the second electrode 11, and the connectors 17, 18 extend through a side wall of second housing 8. The outer leads 15, 16 are connected to a current source.

The first radiator 5 is adhesively secured on the upper surface of the thermoelectric device 4 via an insulator. The edge portion of the side wall 7c is located in the volume 14. A spring washer 26 is disposed in the hole 6c of the second radiator 6 and a screw 24 secures the first radiator 5 and the second radiator 6. Silicon rubber 25 is filled in the hole 6c after the screw 24 inserted in order to provide airtight sealing.

As shown in FIG. 4, an epoxy resin series adhesive material 23 is filled in the volume 14. The adhesive material 23 hardens in the volume 14 and secures the second housing 8 and the second radiator 6. It also secures the first housing 7 and the second housing 8 at the edge portion of the side wall 7c.

In this embodiment, the spring washer 26 applies an appropriate fastening force between the first radiator 5 and the second radiator 6. The adhesive material 23 maintains the appropriate fastening force after the adhesive material 23 hardens. A coil spring can be used instead of the spring washer 26.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by letters patent of the United States is:

1. A heat exchange device comprising:
   a thermoelectric element including a P-type thermoelectric element and an N-type thermoelectric element for generating a cooling surface and a heating surface;
   a first radiator in thermal communication with said cooling surface;
   a first housing connected to said first radiator;
   a second radiator in thermal communication with said heating surface;
   a second housing connected to said second radiator;
   a groove incorporated within one of said housings to retain low viscosity material in position; and
   an adhesive material filling said volume and uniting said first and second housings.

2. A heat exchange device as set forth in claim 1, wherein said groove is formed by said second housing and said second radiator, and wherein a portion of said first housing extends into said groove.

3. A heat exchange device as set forth in claim 1, wherein said adhesive material unites said second radiator and said second housing.

4. A heat exchange device as set forth in claim 1, including a current supplying means extending through said first housing.

5. A heat exchange device as set forth in claim 4, wherein said current supplying means extends within said adhesive material.

6. A heat exchange device as set forth in claim 1, wherein said adhesive material airtightly seals an interior of said housing.

7. A heat exchange device as set forth in claim 1, wherein said adhesive material is made of resin.

* * * * *